(12) United States Patent  
Wright

(10) Patent No.: US 8,769,177 B1  
(45) Date of Patent: Jul. 1, 2014

(54) INTERRUPT LATENCY REDUCTION

(75) Inventor: David G. Wright, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 278 days.

(21) Appl. No.: 12/075,632

(22) Filed: Mar. 12, 2008

Related U.S. Application Data

(60) Provisional application No. 60/906,605, filed on Mar. 12, 2007.

(51) Int. Cl.  
*G06F 13/24* (2006.01)  
*G06F 1/08* (2006.01)

(52) U.S. Cl.  
USPC ............................. 710/260; 713/600

(58) Field of Classification Search  
USPC ........................................ 710/262  
See application file for complete search history.

(56) References Cited

U.S. PATENT DOCUMENTS

| | | | |
|---|---|---|---|
| 4,727,514 A | 2/1988 | Bhuva et al. | |
| 4,734,885 A | 3/1988 | Luich | |
| 5,163,146 A * | 11/1992 | Antanaitis et al. | 713/501 |
| 5,336,951 A | 8/1994 | Josephson et al. | |
| 5,369,703 A | 11/1994 | Archibald et al. | |
| 5,376,834 A | 12/1994 | Carobolante | |
| 5,418,969 A * | 5/1995 | Matsuzaki et al. | 713/322 |
| 5,481,549 A | 1/1996 | Tokuyama | |
| 5,546,568 A * | 8/1996 | Bland et al. | 713/501 |
| 5,568,083 A | 10/1996 | Uchiyama et al. | |
| 5,594,442 A | 1/1997 | Paulos et al. | |
| 5,629,635 A | 5/1997 | Reno | |
| 5,661,685 A | 8/1997 | Lee et al. | |
| 5,664,205 A * | 9/1997 | O'Brien et al. | 713/322 |
| 5,693,570 A | 12/1997 | Cernea et al. | |
| 5,726,995 A | 3/1998 | Wong | |
| 5,748,684 A | 5/1998 | Sanchez | |
| 5,838,950 A | 11/1998 | Young et al. | |
| 5,877,719 A | 3/1999 | Matsui et al. | |
| 5,878,234 A | 3/1999 | Dutkiewicz et al. | |
| 5,925,110 A | 7/1999 | Klein | |
| 6,038,400 A | 3/2000 | Bell et al. | |
| 6,105,155 A | 8/2000 | Cheng et al. | |
| 6,182,163 B1 | 1/2001 | Yamashita et al. | |
| 6,191,614 B1 | 2/2001 | Schultz et al. | |
| 6,195,712 B1 | 2/2001 | Pawlowski et al. | |
| 6,253,268 B1 | 6/2001 | Bjorkengren et al. | |
| 6,256,240 B1 | 7/2001 | Shinozaki | |

(Continued)

FOREIGN PATENT DOCUMENTS

EP 0619548 A1 10/1994

OTHER PUBLICATIONS

U.S. Appl. No. 11/691,676: "Interface Circuit and Method for Programming or Communicating with an Integrated Circuit via a Power Supply Pin," David G. Wright, filed on Mar. 27, 2007; 44 pages.

(Continued)

*Primary Examiner* — Ryan M. Stiglic

(57) ABSTRACT

A method in accordance with one embodiment of the invention can include detecting an interrupt request during execution of an instruction by a processor of an integrated circuit. Additionally, a clock signal frequency can be changed that is received by the processor. An interrupt service routine can be executed that corresponds to the interrupt request.

18 Claims, 6 Drawing Sheets

(56) References Cited

U.S. PATENT DOCUMENTS

| | | | |
|---|---|---|---|
| 6,260,139 B1 | 7/2001 | Alfke | |
| 6,281,716 B1 | 8/2001 | Mihara | |
| 6,298,448 B1* | 10/2001 | Shaffer et al. | 713/322 |
| 6,320,809 B1 | 11/2001 | Raad | |
| 6,330,231 B1 | 12/2001 | Bi | |
| 6,400,605 B1 | 6/2002 | Adkins | |
| 6,429,682 B1 | 8/2002 | Schultz et al. | |
| 6,499,123 B1 | 12/2002 | McFarland et al. | |
| 6,509,845 B1 | 1/2003 | Tanaka | |
| 6,577,157 B1 | 6/2003 | Cheung et al. | |
| 6,577,175 B2 | 6/2003 | Kim et al. | |
| 6,798,254 B2 | 9/2004 | Marshall et al. | |
| 6,865,113 B2 | 3/2005 | Voicu et al. | |
| 6,912,606 B2 | 6/2005 | Fay | |
| 6,924,790 B1 | 8/2005 | Bi | |
| 6,999,342 B2 | 2/2006 | Ooishi | |
| 7,030,668 B1 | 4/2006 | Edwards | |
| 7,089,434 B2 | 8/2006 | Kuo | |
| 7,096,137 B2 | 8/2006 | Shipton et al. | |
| 7,107,178 B2 | 9/2006 | Won et al. | |
| 7,174,144 B2 | 2/2007 | Lin | |
| 7,176,726 B2 | 2/2007 | Bock | |
| 7,228,476 B2 | 6/2007 | Scipioni et al. | |
| 7,269,780 B2 | 9/2007 | Arima et al. | |
| 7,304,923 B2 | 12/2007 | Sano et al. | |
| 7,310,757 B2 | 12/2007 | Ngo et al. | |
| 7,392,409 B2 | 6/2008 | Tateyama | |
| 7,392,447 B2 | 6/2008 | Tang et al. | |
| 7,415,624 B2 | 8/2008 | Miller et al. | |
| 7,415,647 B2 | 8/2008 | Yee | |
| 7,421,291 B2 | 9/2008 | Karaoguz et al. | |
| 7,424,553 B1 | 9/2008 | Borrelli et al. | |
| 7,496,692 B2 | 2/2009 | Holm et al. | |
| 7,508,242 B2 | 3/2009 | Tokuno | |
| 7,532,056 B2 | 5/2009 | Seo | |
| 7,579,895 B2 | 8/2009 | Sun et al. | |
| 7,626,576 B2 | 12/2009 | Anandakumar et al. | |
| 7,672,258 B1 | 3/2010 | Wu et al. | |
| 7,679,964 B2 | 3/2010 | Lee | |
| 7,710,939 B2 | 5/2010 | Shao et al. | |
| 7,739,529 B2 | 6/2010 | Hardman et al. | |
| 7,760,655 B2 | 7/2010 | Wilhelm | |
| 7,795,893 B2 | 9/2010 | Agatsuma | |
| 7,844,308 B2 | 11/2010 | Rhee et al. | |
| 2002/0108011 A1 | 8/2002 | Tanha | |
| 2003/0074364 A1 | 4/2003 | Sewall et al. | |
| 2003/0093751 A1 | 5/2003 | Hohl | |
| 2005/0052437 A1 | 3/2005 | Hudson | |
| 2005/0071730 A1 | 3/2005 | Moyer et al. | |
| 2005/0093572 A1 | 5/2005 | Sun et al. | |
| 2006/0035590 A1 | 2/2006 | Morris et al. | |
| 2006/0212838 A1 | 9/2006 | Carson et al. | |
| 2006/0236147 A1 | 10/2006 | Best et al. | |
| 2008/0071972 A1 | 3/2008 | Kimura | |
| 2008/0086626 A1* | 4/2008 | Jones et al. | 712/225 |
| 2009/0167093 A1 | 7/2009 | Nguyen et al. | |
| 2009/0315582 A1 | 12/2009 | Agatsuma | |

OTHER PUBLICATIONS

USPTO Notice of Allowance for U.S. Appl. No. 11/691,676 dated Jun. 24, 2010; 10 pages.
USPTO Final Rejection for U.S. Appl. No. 11/691,676 dated Feb. 26, 2010; 11 pages.
USPTO Non-Final Rejection for U.S. Appl. No. 11/691,676 dated Oct. 20, 2009; 11 pages.
USPTO Advisory Action for U.S. Appl. No. 11/691,676 dated Aug. 5, 2009; 3 pages.
USPTO Final Rejection for U.S. Appl. No. 11/691,676 dated May 27, 2009; 10 pages.
USPTO Non-Final Rejection for U.S. Appl. No. 11/691,676 dated Nov. 28, 2008; 8 pages.
USPTO Requirement for Restriction/Election for U.S. Appl. No. 11/691,676 dated Aug. 1, 2008; 6 pages.
USPTO Notice of Allowance for U.S. Appl. No. 12/005,775 dated Jun. 19, 2009; 6 pages.
USPTO Non-Final Rejection for U.S. Appl. No. 12/005,775 dated Sep. 22, 2009; 4 pages.
USPTO Non-Final Rejection for U.S. Appl. No. 12/005,775 dated Feb. 11, 2010; 5 pages.
U.S. Appl. No. 12/005,768: "Intelligent Power Supervisor," David G. Wright, filed on Dec. 27, 2007; 43 pages.
USPTO Notice of Allowance for U.S. Appl. No. 12/005,768 dated Jun. 28, 2010; 6 pages.
USPTO Non-Final Rejection for U.S. Appl. No. 12/005,768 dated Feb. 16, 2010; 8 pages.
USPTO Non-Final Rejection for U.S. Appl. No. 12/005,768 dated Aug. 20, 2009; 7 pages.
USPTO Requirement for Restriction/Election for U.S. Appl. No. 12/005,768 dated May 11, 2009; 6 pages.
U.S. Appl. No. 11/973,038: "Programmable Voltage Regulator," David G. Wright, filed on Oct. 4, 2007; 51 pages.
USPTO Non-Final Rejection for U.S. Appl. No. 11/973,038 dated Jul. 1, 2010; 5 pages.
USPTO Final Rejection for U.S. Appl. No. 11/973,038 dated Mar. 25, 2010; 5 pages.
USPTO Non-Final Rejection for U.S. Appl. No. 11/973,038 dated Oct. 23, 2009; 5 pages.
U.S. Appl. No. 11/973,090: "Intelligent Voltage Regulator," David G. Wright, filed on Oct. 4, 2007; 51 pages.
USPTO Non-Final Rejection for U.S. Appl. No. 11/973,090 dated Jun. 22, 2010; 7 pages.
USPTO Advisory Action for U.S. Appl. No. 11/973,090 dated May 20, 2010; 2 pages.
USPTO Final Rejection for U.S. Appl. No. 11/973,090 dated Mar. 9, 2010; 7 pages.
USPTO Non-Final Rejection for U.S. Appl. No. 11/973,090 dated Sep. 21, 2009; 7 pages.
U.S. Appl. No. 12/005,774: "Intelligent Serial Interface," David G. Wright, filed on Dec. 28, 2007; 30 pages.
USPTO Final Rejection for U.S. Appl. No. 12/005,774 dated Mar. 23, 2010; 14 pages.
USPTO Non-Final Rejection for U.S. Appl. No. 12/005,774 dated Sep. 15, 2009; 12 pages.
U.S. Appl. No. 12/005,748: "Firmware Memory of an Integrated Circuit," David G. Wright, filed on Dec. 28, 2007; 31 pages.
USPTO Non-Final Rejection for U.S. Appl. No. 12/005,748 dated May 11, 2010; 14 pages.
U.S. Appl. No. 12/005,950: "Ultra Low Power Sleep Mode," David G. Wright, filed on Dec. 28, 2007; 30.
U.S. Appl. No. 11/904,644: "Configuration of Programmable Device using a DMA Controller," David G. Wright, filed on Sep. 28, 2007; 34 pages.
USPTO Final Rejection for U.S. Appl. No. 11/904,644 dated Apr. 28, 2010; 7 pages.
USPTO Non-Final Rejection for U.S. Appl. No. 11/904,644 dated Oct. 28, 2009; 6 pages.
National Semiconductor, "54150/DM54150/DM741150, 54151A/DM54151A/DM74151A Data Selectors/Multiplexers," Datasheet, Jun. 1989, Downloaded from <www.DatasheetCatalog.com>, pp. 1-10; 11 pages.
U.S. Appl. No. 11/904,643: "Integrity Checking of Configurable Data of Programmable Device," David G. Wright, filed Sep. 28, 2007; 34 pages.
USPTO Notice of Allowance for U.S. Appl. No. 11/904,643 dated Feb. 26, 2010; 8 pages.
USPTO Notice of Allowance for U.S. Appl. No. 11/904,643 dated Nov. 3, 2009; 7 pages.
USPTO Non-Final Rejection for U.S. Appl. No. 11/904,643 dated Apr. 3, 2009; 9 pages.
U.S. Appl. No. 12/005,743: "Acquiring a Mode of an Integrated Circuit," David G. Wright, filed on Dec. 27, 2007; 33 pages.
USPTO Non-Final Rejection for U.S. Appl. No. 12/005,743 dated Jun. 7, 2010; 11 pages.
Baldoni et al., "Properties of Communication Modes in Distributed Systems," Algorithms and Architectures for Parallel Processing, 1995, ICAPP 95, IEEE First ICA/sup 3/PP., IEEE First International

(56) References Cited

OTHER PUBLICATIONS

Conference on, vol. 2, No., pp. 501-504, vol. 2, Apr. 19-21, 1995, doi: 10.1109/ICAPP.1995A72232; 4 pages.

Wong et al., "Flexible Test Mode Design for DRAM Characterization," 1996 Symposium on VLSI Circuits Digest of Technical Papers, Vol., No., pp. 194-195, Jun. 13-15, 1996, doi: 10.1109/VLSIC.1996.507768; 2 pages.

The Authoritative Dictionary of IEEE Standard Terms, Seventh Edition, 2000, (selected definitions) ISBN 0738126012; 6 pages.

U.S. Appl. No. 12/075,632: "Interrupt Latency Reduction," David G. Wright, filed on Mar. 12, 2008; 31 pages.

USPTO Non-Final Rejection for U.S. Appl. No. 12/075,632 dated May 25, 2010; 9 pages.

USPTO Final Rejection for U.S. Appl. No. 12/075,632 dated Feb. 3, 2010; 9 pages.

USPTO Non-Final Rejection for U.S. Appl. No. 12/075,632 dated Jun. 24, 2009; 6 pages.

U.S. Appl. No. 12/075,633: "Encoded Acknowledge Signal for Wireless Communication," David G. Wright, filed on Mar. 12, 2008; 28 pages.

USPTO Non-Final Rejection for U.S. Appl. No. 12/075,633 dated Apr. 26, 2010; 11 pages.

U.S. Appl. No. 12/075,748: "Secure Wireless Transmission," David G. Wright, filed on Mar. 12, 2008; 25 pages.

USPTO Non-Final Rejection for U.S. Appl. No. 12/005,950 dated Sep. 13, 2010; 8 pages.

USPTO Non-Final Rejection for U.S. Appl. No. 11/904,644 dated Aug. 9, 2010; 7 pages.

USPTO Non-Final Rejection for U.S. Appl. No. 12/005,768 dated Oct. 1, 2010; 7 pages.

USPTO Final Rejection for U.S. Appl. No. 11/973,038 dated Oct. 13, 2010; 5 pages.

USPTO Notice of Allowance for U.S. Appl. No. 11/973,038 dated Jan. 6, 2011; 6 pages.

USPTO Notice of Allowance for U.S. Appl. No. 11/973,090 dated Sep. 30, 2010; 6 pages.

USPTO Advisory Action for U.S. Appl. No. 11/904,644 dated Mar. 28, 2011; 2 pages.

USPTO Non-Final Rejection for U.S. Appl. No. 12/005,774 dated Oct. 27, 2010; 14 pages.

USPTO Final Rejection for U.S. Appl. No. 12/075,633 dated Nov. 24, 2010; 13 pages.

USPTO Final Rejection for U.S. Appl. No. 12/075,632 dated Nov. 26, 2010; 10 pages.

USPTO Non-Final Rejection for U.S. Appl. No. 12/005,743 dated Jun. 4, 2010; 12 pages.

USPTO Advisory Action for U.S. Appl. No. 12/075,632 dated Apr. 19, 2010; 3 paegs.

USPTO Notice of Allowance for U.S. Appl. No. 12/005,775 dated Feb. 12, 2010; 6 pages.

USPTO Advisory Action for U.S. Appl. No. 11/904,644 dated Jul. 16, 2010; 3 pages.

USPTO Final Rejection for U.S. Appl. No. 12/005,748 dated Sep. 24, 2010; 15 pages.

USPTO Non-Final Rejection for U.S. Appl. No. 12/005,748 dated Mar. 18, 2011; 13 pages.

USPTO Non-Final Rejection for U.S. Appl. No. 12/075,633 dated Feb. 22, 2011; 12 pages.

USPTO Final Rejection for U.S. Appl. No. 12/005,774 dated Feb. 8, 2011; 12 pages.

USPTO Advisory Action for U.S. Appl. No. 12/005,774 dated Feb. 4, 2011; 3 pages.

USPTO Non-Final Rejection for U.S. Appl. No. 12/005,950 dated Feb. 17, 2011; 9 pages.

USPTO Final Rejection for U.S. Appl. No. 11/904,644 dated Jan. 21, 2011; 7 pages.

USPTO Notice of Allowance for U.S. Appl. No. 12/005,775 dated Dec. 17, 2010; 6 pages.

\* cited by examiner

INTERRUPT LATENCY REDUCTION

CROSS-REFERENCE TO RELATED APPLICATIONS

This patent application claims the benefit of the co-pending U.S. Provisional Patent Application No. 60/906,605 entitled "Programmable Intelligent Integrated Circuits", by David Wright et al., filed Mar. 12, 2007, which is hereby incorporated by reference.

BACKGROUND

Conventional microcontrollers typically operate at frequencies that are lower than the highest clock frequencies that are available within the device. A slower clock frequency is typically used to reduce power consumption by a central processing unit (CPU) of a microcontroller. Usually within a microcontroller there is a very fast master clock signal (e.g., 100 megahertz (MHz)) that is divided down to slower rates and distributed throughout its subunits. For example, in a typical microcontroller, the CPU may operate at only 12 MHz in order to reduce its power consumption. Note that when an interrupt is received by the CPU of the microcontroller, the CPU must complete its current task and then execute an interrupt service routine (ISR) corresponding to the received interrupt. Unfortunately, the slower clocked CPU takes longer to respond to an interrupt request. Therefore, by slowing the CPU's clock to help reduce power consumption, interrupt latency of the microcontroller is increased. It is noted that the interrupt latency is the time it takes the CPU to start executing the ISR once the interrupt is signaled. In certain applications that timing can be critical. One conventional technique for keeping that latency within an acceptable limit is to constantly operate the CPU at a higher clock frequency. However, the disadvantage of this conventional technique is an increase in power consumption by the CPU.

As such, it is desirable to address one or more of the above issues.

SUMMARY

A method in accordance with one embodiment of the invention can include detecting an interrupt request during execution of an instruction by a processor of an integrated circuit. Additionally, a clock signal frequency can be changed that is received by the processor. An interrupt service routine can be executed that corresponds to the interrupt request.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Unless specifically stated otherwise as apparent from the following discussions, it is appreciated that throughout the present detailed description, discussions utilizing terms such as "detecting", "changing", "switching", "determining", "increasing", "decreasing", "storing", "receiving", "executing", "setting", "programming", "utilizing", "resuming", "producing", "beginning", "completing", "outputting", "transmitting", or the like, can refer to the actions and processes of a processor(s) and/or electrical components, an electronic and/or electrical computing device, but is not limited to such. The computing device can manipulate and transform data represented as physical (electronic) quantities within the computing device's registers and/or memories into other data similarly represented as physical quantities within the computing device memories and/or registers or other such information storage or transmission.

Figure 1:
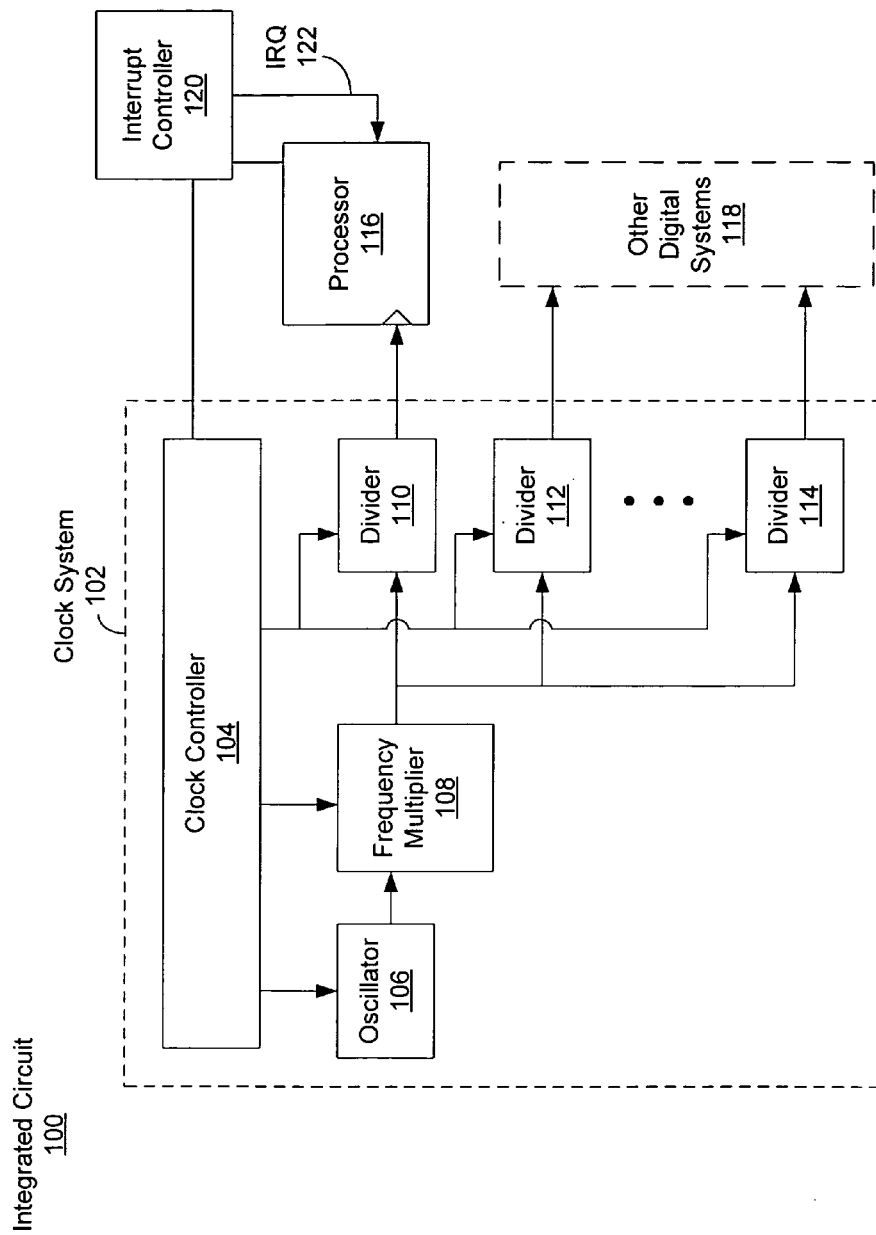
FIG. 1 is a block diagram of an exemplary integrated circuit in accordance with various embodiments of the invention.

FIG. 1 is a block diagram of an exemplary integrated circuit 100 in accordance with various embodiments of the invention. It is noted that the integrated circuit 100 can be implemented in a wide variety of ways. For example in an embodiment, the integrated circuit 100 can be implemented as, but is not limited to, a microcontroller, a microprocessor, and the like. The integrated circuit 100 can include, but is not limited to, a clock system 102, a clock controller 104, an oscillator 106, a frequency multiplier 108, divider circuits 110, 112 and 114, a processor 116, an interrupt controller 120, and other digital systems 118.

Specifically, in one embodiment, one of the functions of the clock system 102 is to reduce the interrupt latency of the integrated circuit 100. It is noted that in an embodiment, the interrupt latency can be the time it takes the processor 116 to start executing an interrupt service routine once an interrupt signal or request (e.g., 122) is detected or received by the interrupt controller circuit 120. Upon detection of the interrupt signal or request 122, the clock rate (or frequency) to the processor 116 can be dynamically increased by the clock system 102 in order to decrease the interrupt latency of the integrated circuit 100. The clock controller 104 of the clock system 102 can be utilized to select between a normal clock rate (or frequency) and a faster clock rate for the processor 116. The clock controller 104 can be controlled by the interrupt controller 120. Upon detection of an interrupt, the interrupt controller 120 can cause the clock system 102 to supply the faster clock signal to the processor 116. Note that in an embodiment, this faster clock signal can be maintained throughout the operation of the associated interrupt service routine. In one embodiment, the faster clock signal can be supplied to the processor 116 just during the latency period, depending on the power constraints of the integrated circuit 100. Note that one of the advantages is the reduction of the interrupt latency while still offering reduced power consumption.

Within FIG. 1, it is pointed out that the clock controller 104 can change the clock signal rate or frequency received by the processor 116 (and possibly the other digital systems 118 of the integrated circuit 100) in a wide variety of ways. For example, the clock controller 104 can dynamically change or modify the operation of the oscillator 106, frequency multiplier 108, divider circuit 110, divider circuit 112, and divider circuit 114 separately or in any type of combination. In one embodiment, if the oscillator 106 is as a crystal-less programmable oscillator, the clock controller 104 can dynamically increase or decrease the output clock signal frequency of the oscillator 106. Furthermore, if the frequency multiplier 108 is implemented as a variable multiplication factor frequency multiplier, the clock controller 104 can dynamically increase or decrease the multiplying function of the frequency multiplier 108 thereby causing its output clock signal frequency to increase or decrease. Moreover, if each of the divider circuits 110-114 is implemented as a variable divider, the clock controller 104 can dynamically changing the divide ratio of each of the divider circuits 110, 112 and 114 thereby causing each output clock signal frequency to increase or decrease.

The oscillator 106 can be implemented in a wide variety of ways. For example, the oscillator 106 can be, but is not limited to, a crystal oscillator, an internal oscillator inside the integrated circuit 100, crystal-less programmable oscillator, it could be a quartz crystal oscillator with an external quartz crystal setting the frequency, or a ceramic resonator oscillator with an external ceramic resonator setting the frequency. The processor 116 can be implemented in a wide variety of ways. For example, the processor 116 can be implemented as a central processing unit (CPU), but is not limited to such. The frequency multiplier 108 can be implemented in a wide variety of ways. For example, the frequency multiplier 108 can be implemented as a phase lock loop (PLL), but is not limited to such.

Within FIG. 1, in one embodiment, the clock controller 104 can be implemented to store two complete sets of clock configurations for controlling the other elements of the clock system 102: one set of clock configurations for normal operation and another set of clock configurations for interrupt operation. In this manner, each set can include a desired combination of configurations for each of the elements of the clock system 102 to achieve the optimal frequency for each of the processor 116 and each of the other digital systems 118 in each operation mode.

For example in an embodiment, it may be desirable that the clock frequency signals output by the dividers 112 and 114 remain the same for both the normal operation configuration and the interrupt operation configuration while the divider 110 outputs two different clock frequency signals to the processor 116. For instance in one embodiment, the normal operation configuration stored by the clock controller 104 can include the oscillator 106 being set at 12 megahertz (MHz), the frequency multiplier 108 may be set to multiply by 3, the divider 110 for the processor 116 can be set to divide by 3, the divider 112 can be set to divide by 4, and the divider 114 can be set to divide by 6. As such, during the normal operation configuration the processor 116 is receiving a 12 MHz clock signal, the divider 112 is outputting a 9 MHz clock signal to the other digital systems 118, and the divider 114 is outputting a 6 MHz clock signal to the other digital systems 118.

Furthermore, in one embodiment, the interrupt operation configuration stored by the clock controller 104 can include the oscillator 106 being set at 54 MHz, the frequency multiplier 108 may be set to multiply by 4, the divider 110 for the processor 116 can be set to divide by 2, the divider 112 can be set to divide by 24, and the divider 114 can be set to divide by 36. As such, during the interrupt operation configuration the processor 116 is receiving a 108 MHz clock signal, the divider 112 is still outputting a 9 MHz clock signal to the other digital systems 118, and the divider 114 is still outputting a 6 MHz clock signal to the other digital systems 118. In this manner, there are two complete groups of settings and when the interrupt is detected, a seamless change can be made from one group of settings to another. Additionally in this embodiment, the clock frequencies received by the other digital systems 118 may remain the same while the clock frequency signal received by the processor 116 is increased during the interrupt operational mode.

Within FIG. 1, it is noted that the clock system 102 can be implemented in a wide variety of ways. For example in one embodiment, the clock system 102 can be implemented not to include any dividers and frequency multipliers while including the clock controller 104 and the oscillator 106 (that is programmable), which can be coupled to the processor 116 and possibly to the other digital systems 118 of the integrated circuit 100. As such, the clock controller 104 can dynamically increase or decrease the output clock frequency signal of the oscillator 116. In an embodiment, the clock system 102 can be implemented not to include any dividers while including the oscillator 106 and one or more frequency multipliers (e.g., 108), which can each be coupled to the processor 116 and possibly to the other digital systems 118 of the integrated circuit 100. In one embodiment, the clock system 102 can be implemented not to include any frequency multipliers while including the oscillator 106 and one or more dividers 110, 112 and 114, which can each be coupled to the processor 116 and possibly to the other digital systems 118 as shown.

The integrated circuit 100 can include, but is not limited to, the clock system 102 that can be coupled to the processor 116 and the other digital systems 118. The clock system 102 can include, but is not limited to, the clock controller 104, the oscillator 106, the frequency multiplier 108, and the divider circuits 110, 112 and 114. Specifically, the clock controller 104 can be coupled to the oscillator 106, the frequency multiplier 108, the interrupt controller 120, and the divider circuits 110, 112 and 114. An output of the oscillator 106 can be coupled to an input of the frequency multiplier 108. An output of the multiplier 108 can be coupled to an input of divider circuit 110, an input of divider circuit 112, and an input of divider circuit 114. An output of the divider circuit 110 can be coupled to a clock input of the processor 116. An output of the divider circuit 112 can be coupled to one or more other digital systems 118 of the integrated circuit 100. An output of the divider circuit 114 can be coupled to one or more other digital systems 118 of the integrated circuit 100. An output of the interrupt controller circuit 120 can be coupled to an input of the processor 116 thereby enabling the processor 116 to receive the interrupt request 122 from the interrupt controller 120. The processor 116 and the interrupt controller 120 are coupled to communicate.

Within FIG. 1, it is understood that the integrated circuit 100 may not include all of the elements illustrated by FIG. 1. Additionally, the integrated circuit 100 can be implemented to include one or more elements not illustrated by FIG. 1.

Figure 2:
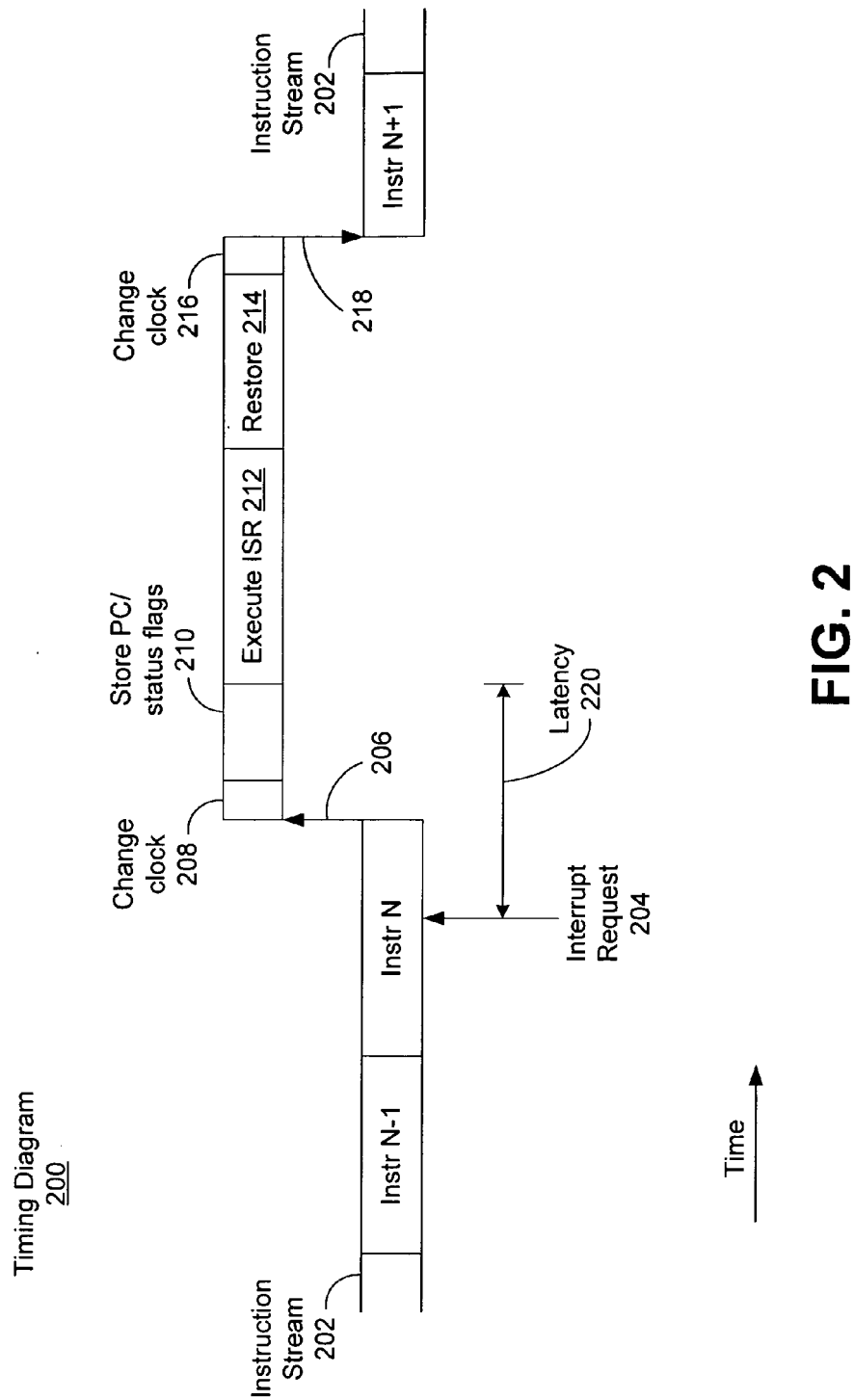
FIG. 2 is an exemplary timing diagram in accordance with various embodiments of the invention.

FIG. 2 is an exemplary timing diagram 200 in accordance with various embodiments of the invention. Note that FIGS. 1 and 2 will be discussed together in order to provide a more complete understanding of various embodiment of the invention. Within FIG. 2, the processor 116 can be executing an instruction stream 202 that includes multiple instructions, such as, Instruction (Instr) N−1, Instruction N, Instruction N+1, and so forth. After execution of Instruction (Instr) N−1, the processor 116 begins execution of Instruction N. While executing Instruction N, the interrupt controller 120 can detect or receive an interrupt request 204 (as shown in FIG. 2). As such, the interrupt controller 120 outputs an interrupt request signal 122 to the processor 116. Once the processor 116 completes the execution of Instruction N, the processor 116 notifies the interrupt controller 120 of this situation. As such, as shown by arrow 206, the interrupt controller 120 can cause the clock controller 104 to increase the clock signal rate received by the processor 116, as indicated by change clock 208.

In an embodiment, once the clock signal frequency is increased to the processor 116, the processor 116 can store the program counter (PC) and one or more status flags 210 that are associated with the instruction stream 202. In one embodiment, while the clock signal frequency to the processor 116 is changing (e.g., being increased), the processor 116 can store the program counter (PC) and one or more status flags 210 that are associated with the instruction stream 202. It is noted that the program counter and the one or more status flags can be subsequently used by the processor 116 to return to the point at which it stopped executing the instruction stream 202. Once the program counter and the one or more status flags are stored 210, the processor 116 can execute the interrupt service routine 212 corresponding with the interrupt request 204. Next, the processor 116 can perform a restore 214 of the program counter and the status flags associated with the instruction stream 202, thereby enabling the processor 116 to return and begin executing the instruction stream 202. The processor 116 notifies the interrupt controller 120 of this situation. As such, the interrupt controller 120 can cause the clock controller 104 to decrease the clock signal rate or frequency received by the processor 116, as indicated by change clock 216. Arrow 218 indicates that the processor 116 can begin executing Instruction N+1 of the instruction stream 202. When implemented in this manner, the interrupt latency 220 can be reduced while still enabling reduced power consumption by the processor 116.

Within FIG. 2, it is noted that the occurrence of the change (or decrease) clock rate 216 to the processor 116 can take place at a different location of timing diagram 200. For example in one embodiment, the occurrence of the change (or decrease) clock rate 216 to the processor 116 can take place after the storing of the program counter and the one or more status flags 210 that are associated with the instruction stream 202. In this manner, the execution by the processor 116 of the interrupt service routine 212 and the restoring 214 of the program counter and the status flags associated with the instruction stream 202 will occur at the slower or normal clock frequency or rate.

Figure 3:
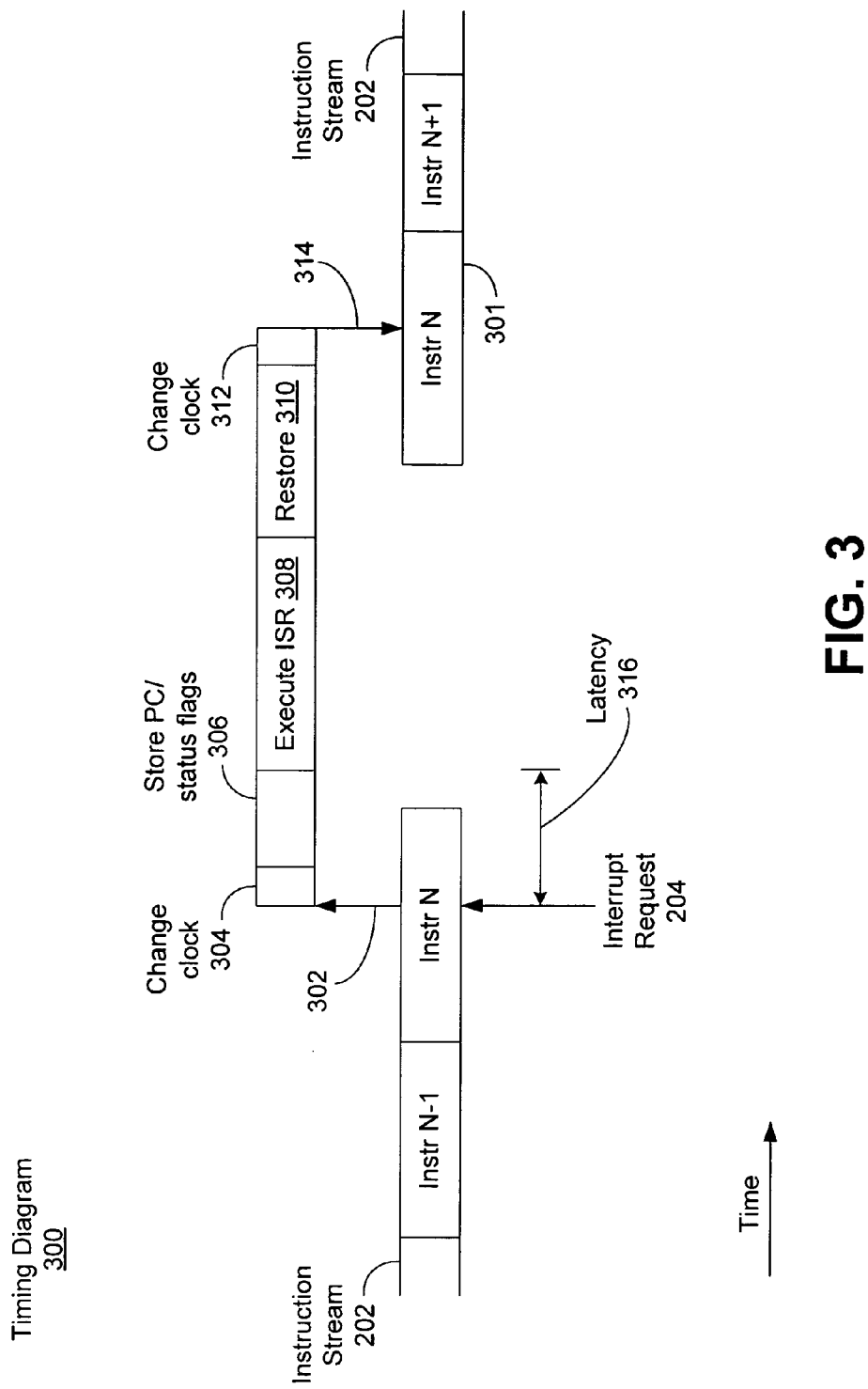
FIG. 3 is an exemplary timing diagram in accordance with various embodiments of the invention.

FIG. 3 is an exemplary timing diagram 300 in accordance with various embodiments of the invention. Note that FIGS. 1 and 3 will be discussed together in order to provide a more complete understanding of various embodiment of the invention. Within FIG. 3, the processor 116 can be executing an instruction stream 202 that includes multiple instructions, such as, Instruction (Instr) N−1, Instruction N, Instruction N+1, and so forth. After execution of Instruction (Instr) N−1, the processor 116 begins executing Instruction N. While executing Instruction N, the interrupt controller 120 can detect or receive an interrupt request 204 (as shown in FIG. 3). As such, the interrupt controller 120 outputs an interrupt request signal 122 to the processor 116 and causes the clock controller 104, as shown by arrow 302, to increase the clock signal rate received by the processor 116, as indicated by change clock 304.

Once the clock signal frequency is increased to the processor 116, the processor 116 can store the program counter (PC) and one or more status flags 306 that are associated with the instruction stream 202. It is pointed out that the program counter and the one or more status flags can be subsequently used by the processor 116 to return to the point at which it stopped executing Instruction N of the instruction stream 202. Once the program counter and the one or more status flags are stored 306, the processor 116 can execute the interrupt service routine 308 corresponding with the interrupt request 204. Next, the processor 116 can perform a restore 310 of the program counter and the status flags associated with Instruction N of the instruction stream 202, thereby enabling the processor 116 to resume executing Instruction N at the point it stopped executing it. The processor 116 notifies the interrupt controller 120 of this situation. As such, the interrupt controller 120 can cause the clock controller 104 to decrease the clock signal rate or frequency received by the processor 116, as indicated by change clock 312. Arrow 314 indicates that the processor 116 can resume executing the remainder of Instruction N of the instruction stream 202. When implemented in this manner, the interrupt latency 316 can be reduced while still enabling reduced power consumption by the processor 116. Note that the interrupt latency 316 of FIG. 3 is shorter in duration that the interrupt latency 220 of FIG. 2. Specifically, the reduction in time of the interrupt latency 316 is the result of not waiting for the processor 116 to finish executing Instruction N of the instruction stream 202 before increasing the clock frequency to processor 116.

Figure 4:
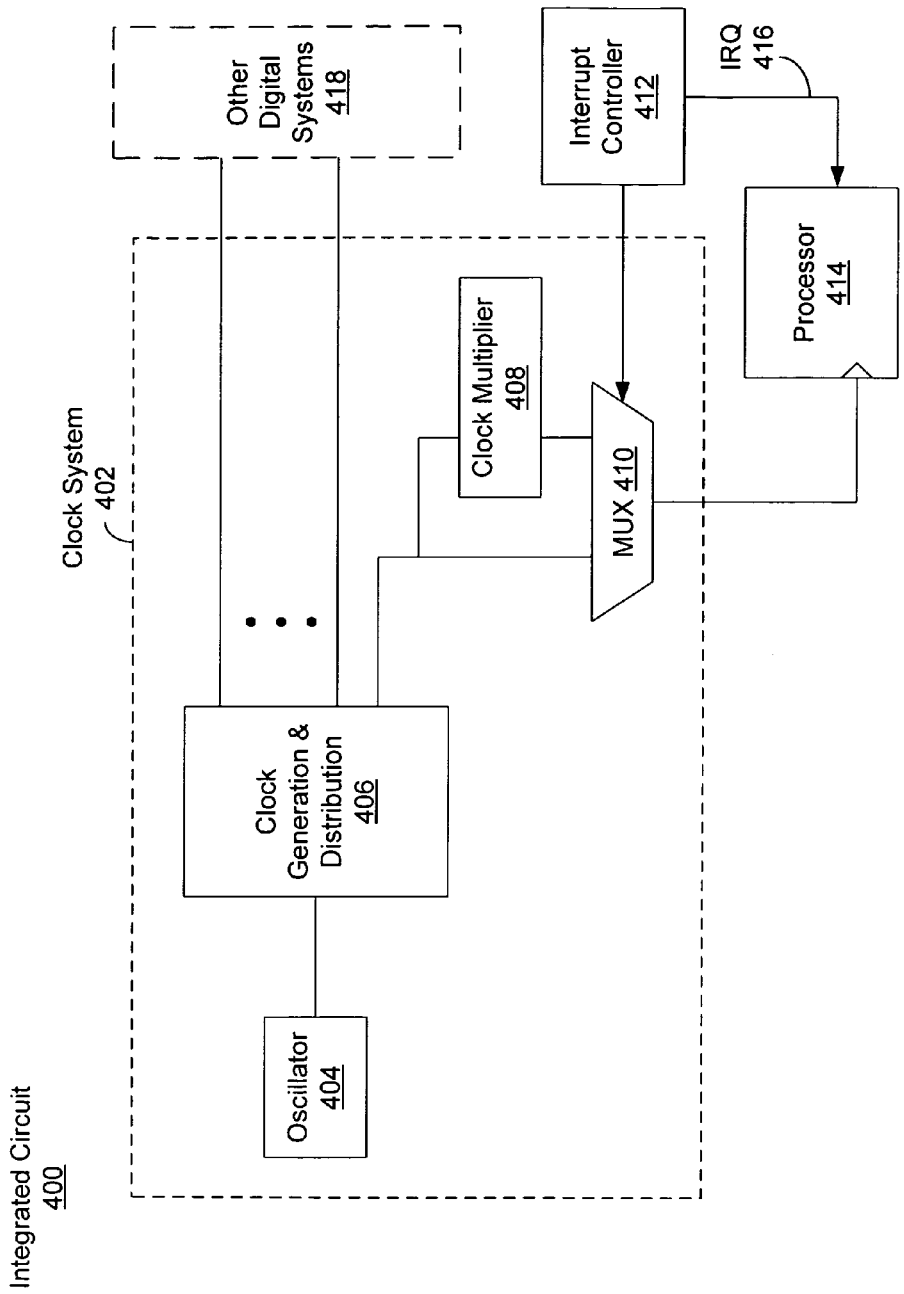
FIG. 4 is a block diagram of another exemplary integrated circuit in accordance with various embodiments of the invention.

FIG. 4 is a block diagram of an exemplary integrated circuit 400 in accordance with various embodiments of the invention. It is noted that the integrated circuit 400 can be implemented in a wide variety of ways. For example in an embodiment, the integrated circuit 400 can be implemented as, but is not limited to, a microcontroller, a microprocessor, and the like. The integrated circuit 400 can include, but is not limited to, a clock system 402, an oscillator 404, a clock generation and distribution circuit 406, a clock multiplier circuit 408, a multiplexer (MUX) 410, an interrupt controller circuit 412, a processor 414, and other digital systems 418 of the integrated circuit 400. In one embodiment, the clock multiplier 408 may comprise a single clock doubler, but is not limited to such.

Specifically, in one embodiment, one of the functions of the clock system 402 is to reduce the interrupt latency of the integrated circuit 400. Note that in an embodiment, the interrupt latency can be the time it takes the processor 414 to start executing an interrupt service routine once an interrupt signal or request (e.g., 416) is detected or received by the interrupt controller circuit 412. Upon detection of the interrupt signal or request 416, the clock rate (or frequency) to the processor 414 can be dynamically increased by the clock system 402 in order to decrease the interrupt latency of the integrated circuit 400. The multiplexer 410 of the clock system 402 can be utilized by the interrupt controller 412 to select between a normal clock rate (or frequency) and a faster clock rate for the processor 414. The multiplexer 410 can be controlled by the interrupt controller 412. Upon detection of an interrupt, the interrupt controller 412 can cause the clock system 402 to supply the faster clock signal to the processor 414. It is pointed out that in an embodiment, this increased clock signal can be maintained throughout the operation of the associated interrupt service routine. In one embodiment, the increased clock signal can be supplied to the processor 414 just during the latency period, depending on the power constraints of the integrated circuit 400. It is noted that one of the advantages is the reduction of the interrupt latency while still offering reduced power consumption.

Within FIG. 4, the oscillator 404 can output a clock frequency signal that can be received by the clock generation and distribution circuit 406. It is noted that the clock generation and distribution circuit 406 can be implemented in a wide variety of ways. For example, the clock generation and distribution circuit 406 can be implemented with, but is not limited to, one or more frequency multipliers (e.g., 108), one or more variable divider circuits (e.g., 110, 112 and/or 114), and the like. It is pointed out that one or more outputs of the clock generation and distribution circuit 406 can be coupled to the other digital systems 418 of the integrated circuit 400. Furthermore, the clock generation and distribution circuit 406 can output a clock frequency signal to the clock multiplier circuit 408 and the multiplexer 410. In one embodiment, the clock multiplier circuit 408 can then double the frequency of the clock signal received from the clock generation and distribution circuit 406. As such, the clock multiplier circuit 408 can output the doubled frequency clock signal to the multiplexer 410. Depending on the control signals received from the interrupt controller 412, the multiplexer 410 either outputs to the processor 414 the clock frequency signal received from the clock generation and distribution circuit 406 or the doubled frequency clock signal received from the clock multiplier circuit 408. It is noted that in an embodiment, the clock multiplier circuit 408 can be implemented to multiple the frequency of the received clock signal by any factor or value.

The oscillator 404 can be implemented in a wide variety of ways. For example, the oscillator 404 can be, but is not limited to, a crystal oscillator, an internal oscillator inside the integrated circuit 400, it could be a quartz crystal oscillator with an external quartz crystal setting the frequency, or it could be a ceramic resonator oscillator with an external ceramic resonator setting the frequency. The processor 414 can be implemented in a wide variety of ways. For example, the processor can be implemented as a central processing unit (CPU), but is not limited to such.

Within FIG. 4, the integrated circuit 400 can include, but is not limited to, the clock system 402 that can be coupled to the processor 414, the interrupt controller circuit 412, and the other digital systems 418. The clock system 402 can include, but is not limited to, the oscillator 404, the clock generation and distribution circuit 406, the clock multiplier circuit 408, and the multiplexer 410. Specifically, an output of the oscillator 404 can be coupled to an input of the clock generation and distribution circuit 406. An output of the clock generation and distribution circuit 406 can be coupled to an input of the clock multiplier circuit 408 and a first input of the multiplexer 410. One or more outputs of the clock generation and distribution circuit 406 can be coupled to one or more other digital systems 418 of the integrated circuit 400. An output of the clock multiplier circuit 408 can be coupled to a second input of the multiplexer 410. An output of the multiplexer 410 can be coupled to a clock input of the processor 414. A first output of the interrupt controller circuit 412 can be coupled to a controller input of the multiplexer 410. A second output of the interrupt controller circuit 412 can be coupled to an input of the processor 414.

Within FIG. 4, it is understood that the integrated circuit 400 may not include all of the elements illustrated by FIG. 4. Additionally, the integrated circuit 400 can be implemented to include one or more elements not illustrated by FIG. 4.

Figure 5:
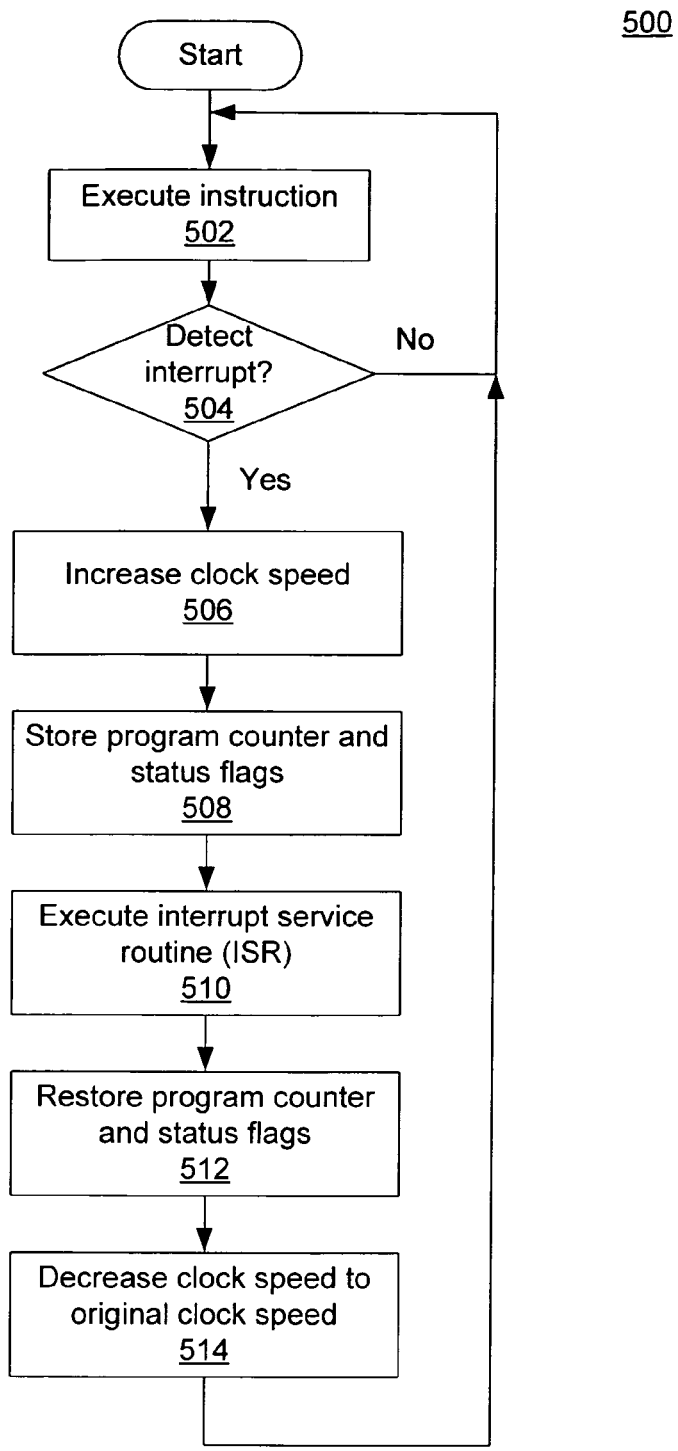
FIG. 5 is a flow diagram of an exemplary method in accordance with various embodiments of the invention.

FIG. 5 is a flow diagram of a method 500 in accordance with various embodiments of the invention for reducing interrupt latency for an integrated circuit (e.g., microcontroller, microprocessor, or the like). Method 500 includes exemplary processes of various embodiments of the invention which can be carried out by a processor(s) and/or electrical components under the control of computing device readable and executable instructions (or code), e.g., software. The computing device readable and executable instructions (or code) may reside, for example, in data storage features such as volatile memory, non-volatile memory and/or mass data storage that are usable by a computing device. However, the computing device readable and executable instructions (or code) may reside in any type of computing device readable medium. Although specific operations are disclosed in method 500, such operations are exemplary. Method 500 may not include all of the operations illustrated by FIG. 5. Also, method 500 may include various other operations and/or variations of the operations shown by FIG. 5. Likewise, the sequence of the operations of method 500 can be modified. It is noted that the operations of method 500 can be performed by software, by firmware, by electronic hardware, by electrical hardware, or by any combination thereof.

Specifically, method 500 can include a processor of an integrated circuit beginning execution of an instruction (e.g., of an instruction stream). After the instruction is executed, it can be determined whether an interrupt request has been detected. If not, the processor can begin executing the next instruction. However, if an interrupt request has been detected, the clock speed can be increased (or changed) to at least the processor and possibly to other components of the integrated circuit. The program counter and status flags associated with the instruction stream being executed by the processor can be stored for later retrieval. The processor can execute the interrupt service routine (ISR) corresponding to the detected (or received) interrupt request. Once the interrupt service routine has been executed, the program counter and the status flags associated with the instruction stream can be restored. The clock speed that is received by the processor (and possibly other components) can be decreased (or changed) to the original clock speed. The processor can begin executing the next instruction of the instruction stream that was previously interrupted. In this manner, the interrupt latency can be reduced while still enabling reduced power consumption by the processor.

At operation 502 of FIG. 5, a processor (e.g., 116 or 414) of an integrated circuit (e.g., 100 or 400) can begin executing an instruction, e.g., of an instruction stream 202. Note that operation 502 can be implemented in a wide variety of ways. For example, operation 502 can be implemented in any manner similar to that described herein, but is not limited to such.

At operation 504, after execution of the instruction, it can be determined whether an interrupt request (e.g., 204) has been detected or received. If not, the process 500 can proceed to operation 502 where the processor can begin executing the next instruction. However, if an interrupt request has been detected or received at operation 504, the process 500 can proceed to operation 506. It is pointed out that operation 504 can be implemented in a wide variety of ways. For example, operation 504 can be implemented in any manner similar to that described herein, but is not limited to such.

At operation 506 of FIG. 5, a clock signal frequency or speed can be increased or changed (e.g., 208) that is received by at least the processor and possibly other components (e.g., 118 or 418) of the integrated circuit. It is noted that operation 506 can be implemented in a wide variety of ways. For example in one embodiment, the supply voltage to the core of an integrated circuit can be increased in enable the clock frequency signal to be set to a maximum possible frequency or rate of the integrated circuit. For instance in an embodiment, an interrupt controller (e.g., 120 or 412) can be implemented to control both the core supply voltage to the integrated circuit in addition to controlling the clock frequency. Note that the operation 506 can be implemented in any manner similar to that described herein, but is not limited to such.

At operation 508, a program counter and one or more status flags (e.g., 210) associated with the instruction stream being executed by the processor can be stored, for example, for later retrieval. Note operation 508 can be implemented in a wide variety of ways. For example, operation 508 can be implemented in any manner similar to that described herein, but is not limited to such.

At operation 510 of FIG. 5, the processor can execute the interrupt service routine (e.g., 212) corresponding to the detected or received interrupt request. It is pointed out that that operation 510 can be implemented in a wide variety of ways. For example, operation 510 can be implemented in any manner similar to that described herein, but is not limited to such.

At operation 512, once the interrupt service routine has been executed, the program counter and the one or more status flags associated with the instruction stream can be restored (e.g., 214). It is noted that operation 512 can be implemented in a wide variety of ways. For example, operation 512 can be implemented in any manner similar to that described herein, but is not limited to such.

At operation 514 of FIG. 5, the clock signal frequency or speed that is received by the processor (and possibly other components) can be decreased or changed (e.g., 216) to the original clock frequency or to another clock frequency. Note that operation 514 can be implemented in a wide variety of ways. For example, operation 514 can be implemented in any manner similar to that described herein, but is not limited to such. At the completion of operation 514, the process 500 can proceed to operation 502 so that the processor can begin executing another instruction, e.g., of the instruction stream that was previously interrupted. In one embodiment, at the completion of operation 514, process 500 can be exited.

Figure 6:
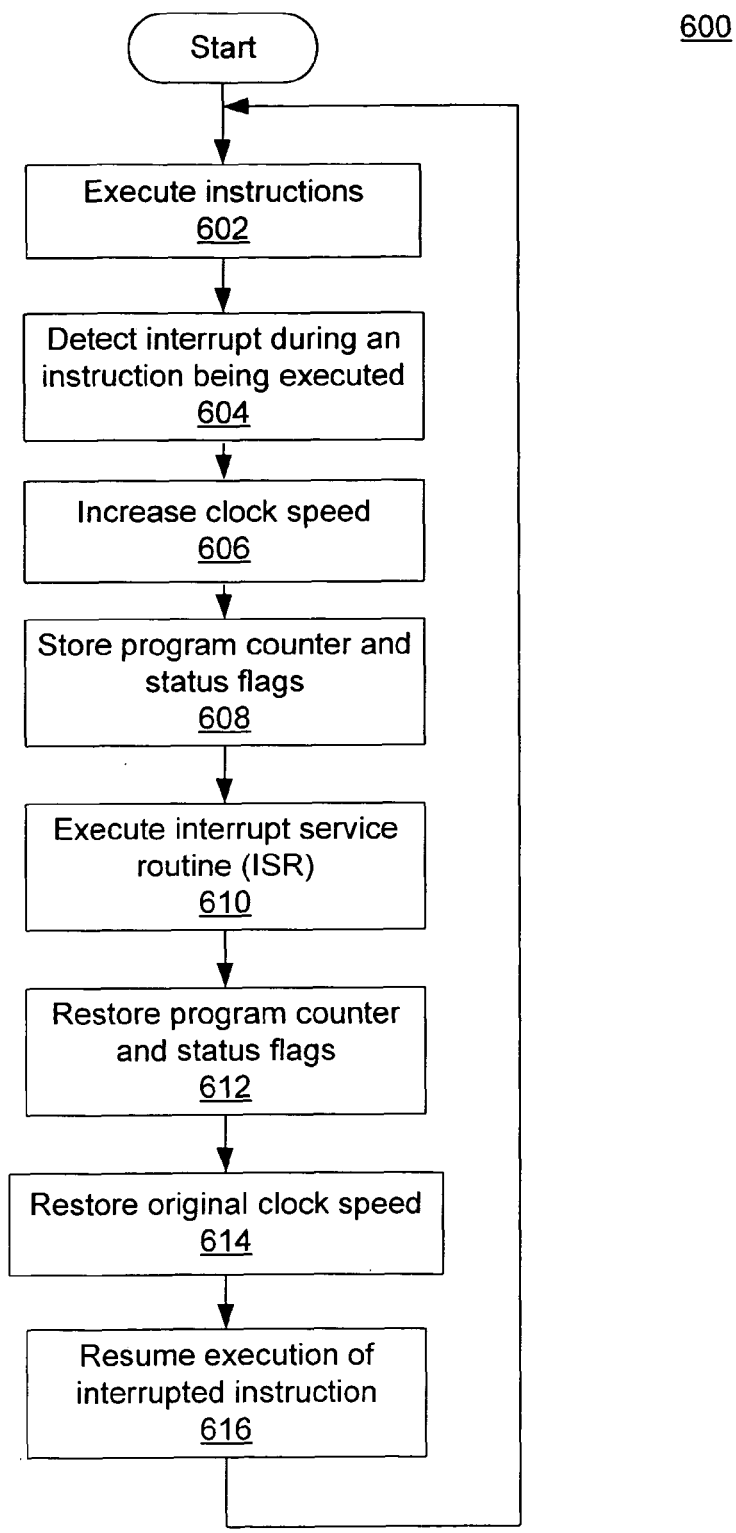
FIG. 6 is a flow diagram of another exemplary method in accordance with various embodiments of the invention.

FIG. 6 is a flow diagram of a method 600 in accordance with various embodiments of the invention for reducing interrupt latency for an integrated circuit (e.g., microcontroller, microprocessor, or the like). Method 600 includes exemplary processes of various embodiments of the invention which can be carried out by a processor(s) and/or electrical components under the control of computing device readable and executable instructions (or code), e.g., software. The computing device readable and executable instructions (or code) may reside, for example, in data storage features such as volatile memory, non-volatile memory and/or mass data storage that are usable by a computing device. However, the computing device readable and executable instructions (or code) may reside in any type of computing device readable medium. Although specific operations are disclosed in method 600, such operations are exemplary. Method 600 may not include all of the operations illustrated by FIG. 6. Also, method 600 may include various other operations and/or variations of the operations shown by FIG. 6. Likewise, the sequence of the operations of method 600 can be modified. It is noted that the operations of method 600 can be performed by software, by firmware, by electronic hardware, by electrical hardware, or by any combination thereof.

Specifically, method 600 can include a processor of an integrated circuit can be executing instructions (e.g., of an instruction stream). An interrupt request can be detected or received during the execution of an instruction. Once the interrupt request is detected or received, the clock speed can be increased (or changed) to at least the processor and possibly to other components of the integrated circuit. The program counter and status flags associated with the instruction that was being executed by the processor can be stored for later retrieval. The processor can execute the interrupt service routine (ISR) corresponding to the detected or received interrupt request. Once the interrupt service routine has been executed, the program counter and the status flags associated with the instruction that was interrupted can be restored. The clock speed that is received by the processor (and possibly other components) can be decreased (or changed) to the original clock speed or to another clock speed. The processor can resume execution of the interrupted instruction. Once the instruction is completed, the processor can continue to execute instructions (e.g., of the instruction stream). In this manner, the interrupt latency can be reduced while still enabling reduced power consumption by the processor.

At operation 602 of FIG. 6, a processor (e.g., 116 or 414) of an integrated circuit (e.g., 100 or 400) can be executing instructions, e.g., of an instruction stream 202. Note that operation 602 can be implemented in a wide variety of ways. For example, operation 602 can be implemented in any manner similar to that described herein, but is not limited to such.

At operation 604, an interrupt request (e.g., 204) can be detected or received during the execution of an instruction by the processor. It is pointed out that operation 604 can be implemented in a wide variety of ways. For example, operation 604 can be implemented in any manner similar to that described herein, but is not limited to such.

At operation 606 of FIG. 6, once the interrupt request is detected or received, a clock signal frequency (or speed) can be increased or changed (e.g., 304) that is received by at least the processor and possibly other components (e.g., 118 or 418) of the integrated circuit. It is noted that operation 606 can be implemented in a wide variety of ways. For example, operation 606 can be implemented in any manner similar to that described herein, but is not limited to such.

At operation 608, a program counter and one or more status flags (e.g., 306) associated with the instruction that was being executed by the processor can be stored, for example, for later retrieval. Note operation 608 can be implemented in a wide variety of ways. For example, operation 608 can be implemented in any manner similar to that described herein, but is not limited to such.

At operation 610 of FIG. 6, the processor can execute an interrupt service routine (e.g., 308) corresponding to the detected or received interrupt request. It is pointed out that that operation 610 can be implemented in a wide variety of ways. For example, operation 610 can be implemented in any manner similar to that described herein, but is not limited to such.

At operation 612, once the interrupt service routine has been executed, the program counter and the one or more status flags associated with the instruction that was interrupted can be restored (e.g., 310). It is noted that operation 612 can be implemented in a wide variety of ways. For example, operation 612 can be implemented in any manner similar to that described herein, but is not limited to such.

At operation 614 of FIG. 6, the clock signal frequency or speed that is received by the processor (and possibly other components) can be decreased or changed (e.g., 312) to the original clock signal frequency or to another clock signal frequency. Note that operation 614 can be implemented in a wide variety of ways. For example, operation 614 can be implemented in any manner similar to that described herein, but is not limited to such.

At operation 616, the processor can resume execution of the interrupted instruction. It is pointed out that that operation 616 can be implemented in a wide variety of ways. For example, operation 616 can be implemented in any manner similar to that described herein, but is not limited to such. At the completion of operation 616, the process 600 can proceed to operation 602 to continue executing instructions. In one embodiment, at the completion of operation 616, process 600 can be exited.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. An integrated circuit comprising:
a processor configured to execute instructions;
an interrupt controller coupled to the processor, the interrupt controller configured to transmit an interrupt request to the processor; and
a clock system coupled to the processor, the clock system configured to increase a clock signal frequency received by the processor in response to the interrupt request after the interrupt controller receives a notification signal from the processor and before the processor executes further instructions, wherein the further instructions comprise execution of the interrupt request.

2. The integrated circuit of claim 1, wherein the processor is configured to send the notification signal when the processor completes execution of a currently executing instruction.

3. The integrated circuit of claim 1, wherein the processor is configured to send the notification signal before the processor completes execution of a currently executing instruction.

4. The integrated circuit of claim 1, wherein the clock system is configured to supply clock pulses to the processor at the increased frequency until the processor has completed execution of the interrupt request.

5. The integrated circuit of claim 1, wherein the clock system is configured to respond to receiving the interrupt request by increasing the clock signal frequency received by the processor until the processor commences execution of the interrupt request.

6. The integrated circuit of claim 1, wherein the clock system comprises:
an oscillator;
a frequency multiplier coupled to the oscillator;
a divider circuit coupled to the frequency multiplier and the processor; and
another divider circuit coupled to the frequency multiplier and to at least one system of the integrated circuit.

7. The integrated circuit of claim 1, wherein the at least one system receives a clock signal frequency equal to one half the frequency of the clock signal frequency received by the processor in the absence of the interrupt request.

8. The integrated circuit of claim 1, wherein the at least one system receives a clock signal frequency equal to three quarters the frequency of the clock signal frequency received by the processor in the absence of the interrupt request.

9. An integrated circuit comprising:
a processor configured to execute instructions;
a clock system coupled to supply clock signals to the processor and to at least one system of the integrated circuit; and
an interrupt controller coupled to the processor and the clock system, the interrupt controller configured to transmit an interrupt request to the processor and to the clock system; the clock system configured to respond to the interrupt request by increasing a clock signal frequency supplied to the processor after the interrupt controller receives a notification signal from the processor and before the processor executes further instructions, wherein the further instructions comprise storing a program counter and a status flag associated with an instruction of a program currently being executed by the processor, and by subsequently decreasing the clock signal frequency supplied to the processor before the processor executes a next instruction of the program.

10. The integrated circuit of claim 9, wherein the clock system comprises a multiplexer coupled to the processor, wherein the interrupt controller is coupled to the multiplexer.

11. The integrated circuit of claim 10, wherein the clock system comprises an oscillator coupled to input the clock signal to the multiplexer.

12. The integrated circuit of claim 10, wherein the clock system comprises a clock multiplier circuit coupled to the multiplexer, the clock multiplier circuit configured to increase the frequency of a clock signal received from the oscillator, the multiplexer is responsive to the interrupt request to couple the increased frequency clock signal to the processor.

13. An integrated circuit comprising:
a processor configured to execute instructions;
a clock system coupled to supply clock signals to the processor and to at least one digital system of the integrated circuit;
an interrupt controller coupled to the processor and to the clock system, the interrupt controller configured to transmit an interrupt request to the processor and to the clock system;
the clock system configured to respond to the interrupt request by increasing from a first frequency to a higher frequency, a clock signal frequency supplied to the processor after the interrupt controller receives a notification signal from the processor and before the processor executes further instructions, wherein the further instructions comprise execution of the interrupt request; by decreasing to the first frequency the clock signal frequency supplied to the processor when the execution of the interrupt request has completed; and by maintaining unchanged a frequency of clock signals to said at least one digital system.

14. The integrated circuit of claim 13, in which the clock system is also coupled to supply clock signals to a further digital system of the integrated circuit, the clock signals supplied to the at least one digital system and to the further digital system having different frequencies.

15. The integrated circuit of claim 14, wherein the clock system comprises a frequency multiplier coupled to an oscillator, a first frequency divider coupling the frequency multiplier to the processor, a second frequency divider coupling the frequency multiplier to the at least one digital system, and a third frequency divider coupling the frequency multiplier to the further digital system.

16. The integrated circuit of claim 15, wherein the frequency multiplier has selectable multiplication factors, and the first, second and third frequency dividers have selectable division factors.

17. The integrated circuit of claim 13, wherein in response to an interrupt request received by the interrupt controller during execution of an instruction of a program by the processor, a program counter and a status flag associated with the instruction of the program are stored by the processor before the increase in frequency of clock signals supplied by the clock system to the processor.

18. The integrated circuit of claim 13, wherein the clock system is coupled to supply to the at least one digital system, a clock signal frequency equal to one half the frequency of the clock signal frequency supplied to the processor in the absence of the interrupt request.

* * * * *